United States Patent [19]
Gardner et al.

[11] Patent Number: 5,854,115
[45] Date of Patent: Dec. 29, 1998

[54] FORMATION OF AN ETCH STOP LAYER WITHIN A TRANSISTOR GATE CONDUCTOR TO PROVIDE FOR REDUCTION OF CHANNEL LENGTH

[75] Inventors: Mark I. Gardner, Cedar Creek; Daniel Kadosh; Michael P. Duane, both of Austin, all of Tex.

[73] Assignee: Advanced Micro Devices, Inc.

[21] Appl. No.: 979,042

[22] Filed: Nov. 26, 1997

[51] Int. Cl.⁶ ................................................. H01L 21/336
[52] U.S. Cl. ......................... 438/305; 438/306; 438/528; 438/532; 438/970
[58] Field of Search ................................... 438/305, 306, 438/407, 459, 528, 532, 585, 592, 970, 954

[56] References Cited

U.S. PATENT DOCUMENTS

| | | | |
|---|---|---|---|
| 4,601,779 | 7/1986 | Abernathey et al. | 438/459 |
| 4,663,827 | 5/1987 | Nakahara | 438/528 |
| 4,774,197 | 9/1988 | Haddad et al. | 438/954 |
| 5,567,638 | 10/1996 | Lin et al. | 438/592 |
| 5,753,557 | 5/1998 | Tseng | 438/305 |

*Primary Examiner*—Charles L. Bowers, Jr.
*Assistant Examiner*—Jack Chen
*Attorney, Agent, or Firm*—Kevin L. Daffer; Conley, Rose & Tayon

[57] ABSTRACT

A process is provided for forming a transistor gate conductor having an etch stop arranged at a depth below its upper surface such that the lateral width of the gate conductor above the etch stop may be exclusively narrowed to provide for reduction of transistor channel length. A masking layer, i.e., photoresist, patterned above the gate conductor is isotropically etched so as to minimize its lateral width prior to etching the gate conductor. Portions of the gate conductor not protected by the photoresist may be etched from above the etch stop to define a new pair of opposed sidewall surfaces for the upper portion of the gate conductor. The lateral width of the upper portion of the gate conductor thus may be reduced to a smaller dimension than that of conventional gate conductors. The gate conductor is subjected to an anisotropic etch in which portions of the gate conductor not protected by the narrowed photoresist are etched down to the etch stop. The presence of the etch stop ensures that substantial portions of the etch stop and underlying portions of the gate conductor are not removed before etching is completely terminated. As a result, a lower portion of the multi-layered gate conductor is wider than an upper portion of the gate conductor.

12 Claims, 4 Drawing Sheets

FORMATION OF AN ETCH STOP LAYER WITHIN A TRANSISTOR GATE CONDUCTOR TO PROVIDE FOR REDUCTION OF CHANNEL LENGTH

BACKGROUND OF THE INVENTION

1. Field of the Invention

This invention relates to integrated circuit fabrication and, more particularly, to forming a transistor gate conductor having an etch stop arranged at a depth below its upper surface such that the lateral width of the gate conductor above the etch stop may be exclusively narrowed to provide for reduction of transistor channel length.

2. Description of the Relevant Art

Fabrication of a MOSFET device is well known. Generally speaking, MOSFETs are manufactured by placing an undoped polycrystalline silicon ("polysilicon") material over a relatively thin gate oxide arranged above a semiconductor substrate. The polysilicon material and the gate oxide are patterned to form a gate conductor with source/drain regions (i.e., junctions) adjacent to and on opposite sides of the gate conductor within the substrate. The gate conductor and source/drain regions are then implanted with an impurity dopant. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single monolithic substrate.

Because of the increased desire to build faster and more complex integrated circuits, it has become necessary to reduce the transistor threshold voltage, $V_T$. Several factors contribute to $V_T$, one of which is the effective channel length ("Leff") of the transistor. The distance between the source-side junction and the drain-side junction of a transistor is often referred to as the physical channel length. However, after implantation and subsequent diffusion of the junctions, the actual distance between junctions becomes less than the physical channel length and is often referred to as the effective channel length. In VLSI designs, as the physical channel length is decreased, the Leff is also decreased. As Leff becomes smaller, the distance between the depletion regions associated with the source and drain areas within the junctions of a transistor decreases. As a result, less gate charge is required to invert the channel of a transistor having a short Leff. Accordingly, reducing the physical channel length, and hence the Leff, can lead to a reduction in the threshold voltage of a transistor. Consequently, the switching speed of the logic gates of an integrated circuit employing transistors with reduced Leff is faster, allowing the integrated circuit to quickly transition between logic states (i.e., operate at high frequencies).

Unfortunately, minimizing the physical channel length of a transistor is somewhat limited by conventional techniques used to define the gate conductor of the transistor. As mentioned earlier, the gate conductor is typically formed from a polysilicon material. A technique known as "lithography" is used to pattern a photosensitive film (i.e., "photoresist") above the polysilicon material. An optical image is transferred to the photoresist by projecting a form of radiation, primarily ultraviolet light, through the transparent portions of a mask plate. The solubility of regions of the photoresist exposed to the radiation is altered by a photochemical reaction. The photoresist is then washed with a solvent that preferentially removes resist areas of higher solubility. As such, the now patterned photoresist exposes portions of the polysilicon material to be removed and covers the portion of the polysilicon material to be retained for the gate conductor. Those exposed portions of the polysilicon material not protected by photoresist are then etched. The photoresist, being substantially resistant to attack by etchants, remains intact during the etch step, and thereby prevents underlying material from being etched. In this manner, opposed sidewall surfaces for the polysilicon material arranged underneath the photoresist are defined to form a gate conductor.

The lateral width (i.e., the distance between opposed sidewall surfaces) of a gate conductor as defined by the lateral width of an overlying photoresist layer dictates the physical channel length of a transistor. Unfortunately, the minimum lateral dimension that can be achieved for a patterned photoresist layer is limited by, inter alia, the resolution of the optical system (i.e., aligner or printer) used to project an image onto the photoresist. The term "resolution" describes the ability of an optical system to distinguish closely spaced objects. The resolution of modern aligners is mainly dependent upon diffraction effects in which radiation passing past an edge or through a slit on a masking plate spreads into regions not directly exposed to oncoming waves. As such, the features patterned upon a masking plate may not be correctly printed onto photoresist. Particularly, the images projected onto photoresist typically have larger dimensions than their corresponding features on the masking plate.

It would therefore be desirable to develop a transistor fabrication technique in which the channel length of the transistor is reduced so as to provide for high frequency operation of an integrated circuit employing the transistor. More specifically, a process is needed in which the resolution of an optical aligner no longer limits the minimum achievable dimensions of a patterned photoresist feature. Once the dimensions of a photoresist feature are minimized, the lateral width of a gate conductor patterned using optical lithography can be reduced. Since the lateral width of a gate conductor dictates the physical channel length of a transistor, such a process would cause a reduction in the Leff of a transistor as well. Minimizing Leff could have the advantageous effect of lowering the threshold voltage of the transistor.

SUMMARY OF THE INVENTION

The problems outlined above are in large part solved by the technique hereof for fabricating a transistor in which the lateral width of an upper portion of a gate conductor arranged above an etch stop is minimized. In particular, a masking layer, i.e., photoresist, patterned above the gate conductor is isotropically etched so as to minimize its lateral width prior to etching the gate conductor. Consequently, the resulting lateral width of the photoresist is not subjected to the limitations presented by optical lithography. That is, the resolution of an optical aligner does not determine the minimum lateral width of the photoresist. Portions of the gate conductor not protected by the photoresist may be etched from above the etch stop to define a new pair of opposed sidewall surfaces for the upper portion of the gate conductor. The lateral width of the upper portion of the gate conductor thus may be reduced to a smaller dimension than that of conventional gate conductors.

In an embodiment, the gate conductor is composed of polysilicon, and the etch stop is a region of the polysilicon implanted with foreign atoms, preferably nitrogen atoms. The gate conductor is preferably subjected to an anisotropic etch in which ion bombardment of the polysilicon occurs more frequently upon horizontal surfaces than vertical surfaces. As such, portions of the gate conductor not protected by the narrowed photoresist are etched down to the etch stop. The etch stop undergoes etching at a much slower rate than other portions of the polysilicon gate conductor. The etch duration is chosen to terminate after the unmasked portions of the gate conductor have been removed from above the etch stop. The presence of the etch stop ensures that substantial portions of the etch stop and underlying portions of the gate conductor are not removed before etching is completely stopped. As a result, a lower portion of the multi-layered gate conductor is wider than an upper portion of the gate conductor. Therefore, a vertically oriented inner portion of the gate conductor is thicker than opposed lateral ends of the gate conductor.

A single implant of dopant species may then be forwarded to the resulting semiconductor topography. The thicker inner portion of the gate conductor may serve to prevent energetic ions from passing into a channel region of the ensuing transistor. As such, the channel region of the ensuing transistor is aligned between the opposed sidewall surfaces of the upper portion of the gate conductor. The physical channel length, and hence the Leff, of the resulting transistor are thus dictated by the lateral width of the upper portion of the gate conductor. In this manner, the Leff is minimized such that the threshold voltage of the resulting transistor is reduced. As a result, an integrated circuit employing the transistor and others like it can more quickly transition between logic states.

The thinner opposed lateral ends of the gate conductor may inhibit a portion of the energetic ions passing therethrough from reaching the underlying substrate. In this manner, lightly doped drain ("LDD") areas implanted with a light concentration of dopant are aligned between the opposed sidewall surfaces of the lower gate conductor and the opposed sidewall surfaces of the upper gate conductor. All of the energetic ions directed toward exposed regions of the substrate come to rest within source/drain regions of the substrate which are aligned to the sidewall surfaces of the lower gate conductor. The source/drain regions contain a high concentration of dopant, and extend to a greater depth below the substrate surface than the LDD areas.

Thereafter, the opposed lateral ends of the gate conductor extending beyond the opposed sidewall surfaces of the upper portion of the gate conductor may be removed via an etch technique. A gate dielectric arranged across the semiconductor substrate underneath the gate conductor may simultaneously be etched such that the gate dielectric is arranged exclusively underneath the gate conductor. The photoresist may again serve to protect underlying regions of the gate conductor from being removed. As a result, the lateral width of the lower portion of the gate conductor is made substantially equivalent to the lateral width of the upper portion of the gate conductor. Sidewall spacers may be formed upon the resulting opposed sidewall surfaces of the gate conductor above the LDD areas of the substrate. After removal of the photoresist, low resistivity silicide contact regions may be formed upon the source/drain regions and upon the upper surface of the gate conductor.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
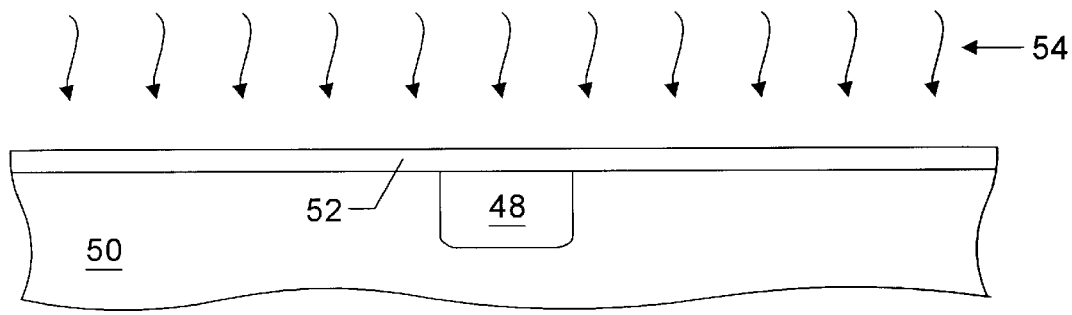
FIG. 1 is a cross-sectional view of a semiconductor topography, wherein a gate oxide is thermally grown across a semiconductor substrate.
Figure 2:
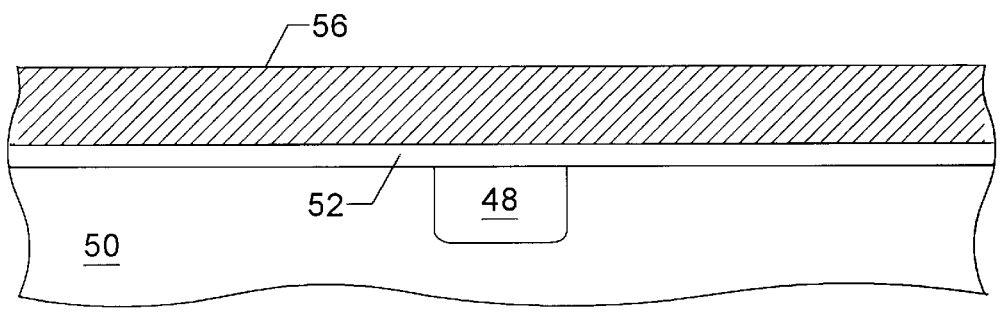
FIG. 2 is a cross-sectional view of the semiconductor topography, wherein a polysilicon layer is deposited across the gate oxide, subsequent to the step in FIG. 1.

Turning now to FIG. 1, a partial cross-sectional view of a semiconductor substrate 50 is depicted. Substrate 50 comprises single crystalline silicon and dielectric isolation regions, such as shallow trench isolation structure 48, arranged spaced distances apart for dielectrically isolating ensuing active areas. The dielectric isolation regions may alternately include well known LOCOS structures. Substrate 50 is slightly doped with ntype or p-type impurities. A gate dielectric 52 may be formed by subjecting silicon-based substrate 50 to thermal radiation 54 in an oxygen bearing ambient. As such, gate dielectric 52 may be a thermally grown oxide. FIG. 2 depicts the chemical-vapor deposition ("CVD") of a polysilicon layer 56 across gate dielectric 52. Polysilicon layer 56 may be deposited from, e.g., a silane source.

Figure 3A:
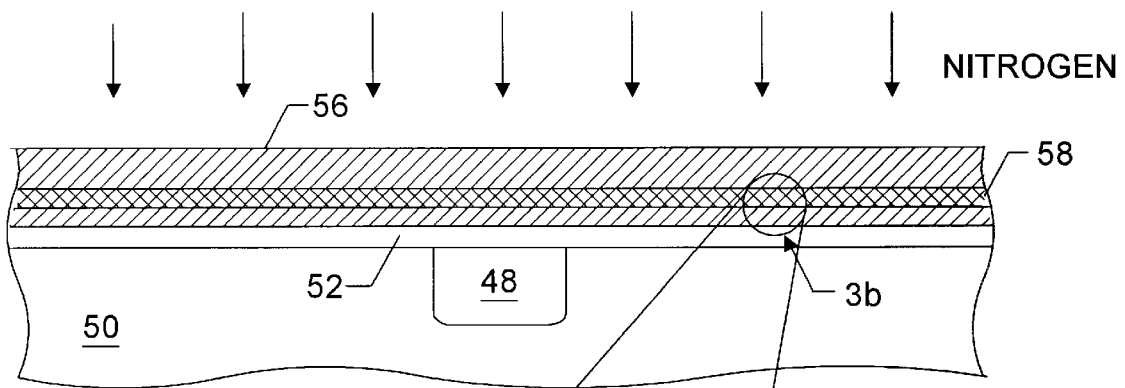
FIG. 3a is a cross-sectional view of the semiconductor topography, wherein nitrogen is implanted into the polysilicon layer to form an etch stop a spaced distance below the upper surface of the polysilicon layer, subsequent to the step in FIG. 2.
Figure 3B:
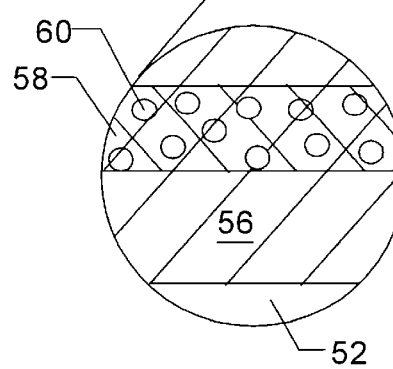
FIG. 3b is a detailed view along section 3b of FIG. 3a showing nitrogen atoms incorporated within the polysilicon layer.

As shown in FIG. 3a, barrier atoms, preferably nitrogen atoms, may be implanted into a region of polysilicon layer 56 spaced below the upper surface of the polysilicon layer using ion implantation. In this manner, an etch stop region 58 is formed within polysilicon layer 56 which is incorporated with nitrogen atoms. FIG. 3b depicts a detailed view along section 3b of FIG. 3a. As shown, nitrogen atoms 60 are positioned throughout etch stop region 58. The nitrogen atoms 60 may fill available vacancy and interstitial positions within etch stop region 58. Accordingly, the pathways of dopant species which may later reside within polysilicon layer 56 may be blocked by nitrogen atoms 60, advantageously preventing the passage of the dopant species down into gate oxide 52. Otherwise, the resistivity of an ensuing gate conductor formed from polysilicon layer 56 could undesirably decrease from the loss of dopant species. The nitrogen atoms 60 may occupy opportune bond sites and terminate dangling bonds within etch stop region 58 of polysilicon layer 56. Relatively strong Si-N that are not easily broken may thereby be formed within etch stop region 58. As a result, very few silicon atoms within etch stop region 58 are free to bond with species used to etch polysilicon layer 56. Thus, volatile compounds are not easily created from the silicon atoms within etch stop region 58. Consequently, etch stop region 58 is substantially resistant to attack by etchants that are typically used to etch polysilicon.

Figure 4:
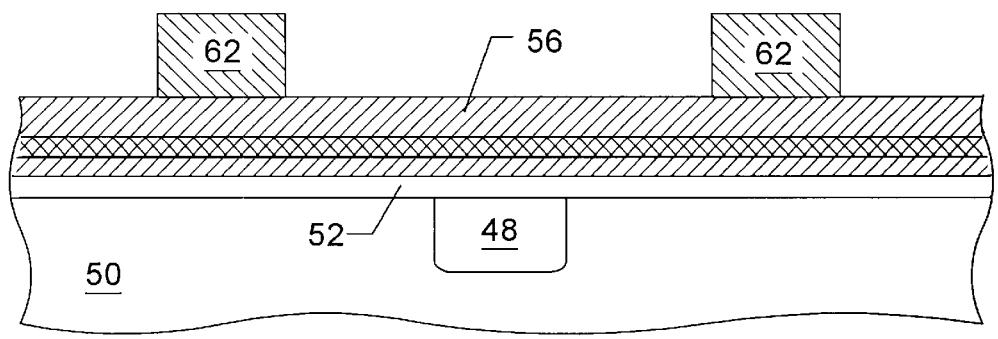
FIG. 4 is a cross-sectional view of the semiconductor topography, wherein photoresist structures are patterned above select portions of the polysilicon, subsequent to the step in FIG. 3.
Figure 5:
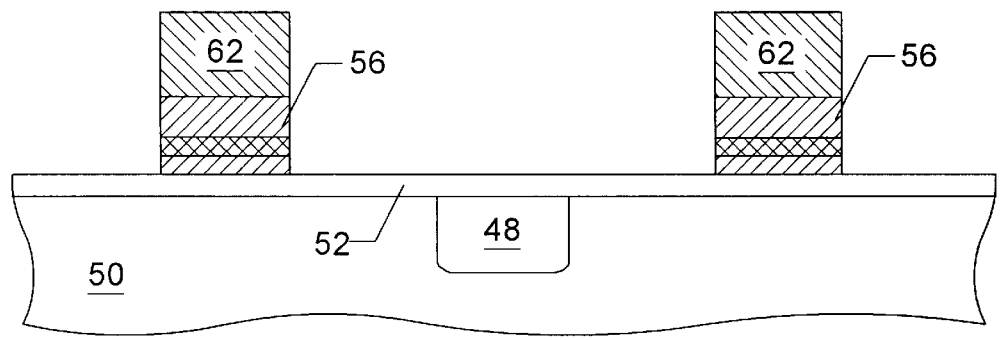
FIG. 5 is a cross-sectional view of the semiconductor topography, wherein portions of the polysilicon layer not covered by the photoresist structures are removed to form laterally spaced apart gate conductors, subsequent to the step in FIG. 4.
Figure 6:
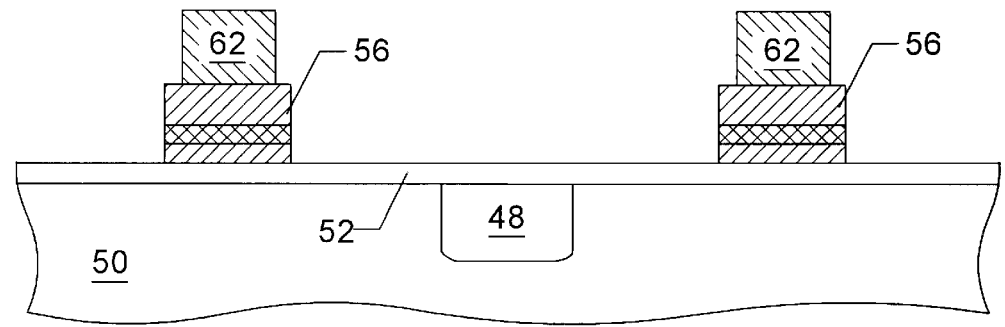
FIG. 6 is a cross-sectional view of the semiconductor topography, wherein the photoresist structures are etched so as to reduce the lateral width of each structure, subsequent to the step in FIG. 5.

Turning to FIG. 4, masking structures 62 are patterned across polysilicon layer 56. Masking structures 62 are preferably composed of photoresist patterned using optical lithography. Portions of polysilicon layer 56 not covered by masking structures 62 may then be removed using an etch technique, e.g., a dry, plasma etch, as shown in FIG. 5. Masking structures 62 are substantially resistant to attack by the etchants, and thus protect underlying material from being etched. FIG. 6 illustrates masking structures 62 being subjected to a blanket isotropic etch technique which occurs at the same rate in all directions. In this manner, the width of each of the masking structures 62 is decreased, and more closely spaced sidewalls are defined for the masking structures. Etch is terminated after a select lateral amount of structures 62 is removed.

Figure 7:
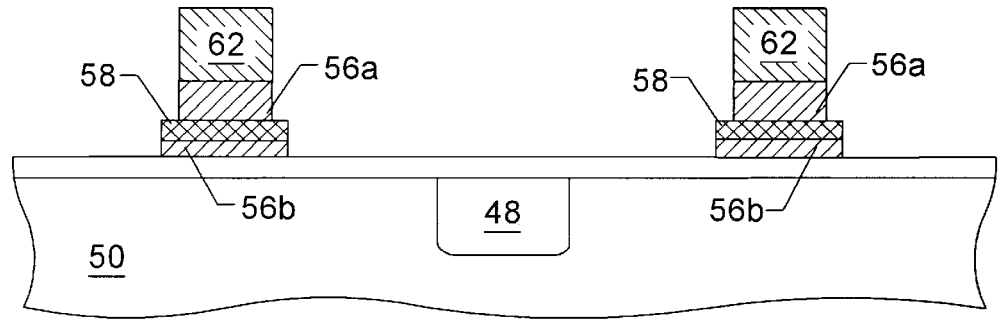
FIG. 7 is a cross-sectional view of the semiconductor topography, wherein an upper portion of each of the gate conductors arranged above the etch stop is etched to reduce its lateral width, subsequent to the step in FIG. 6.
Figure 8:
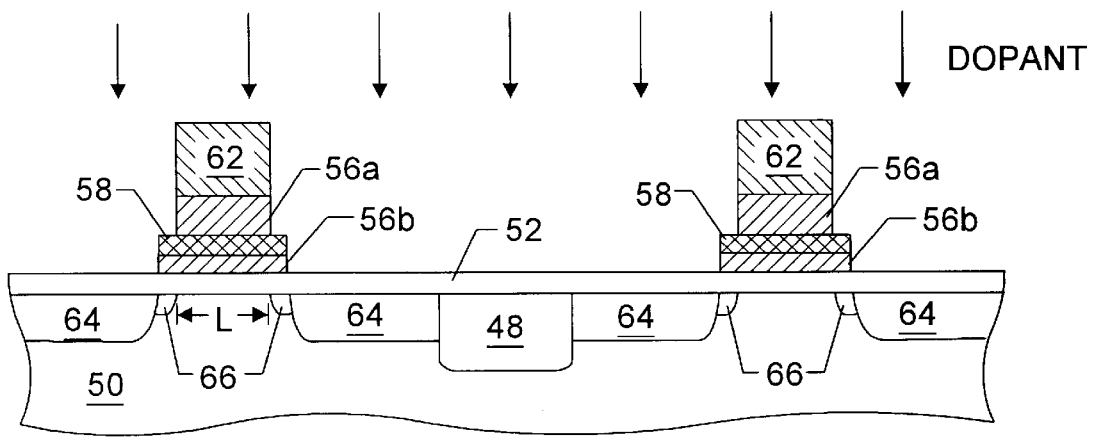
FIG. 8 is a cross-sectional view of the semiconductor topography, wherein dopant species are implanted into the substrate to form source/drain regions and LDD areas therein, subsequent to the step in FIG. 7.

Given a lessened width of structures 62, upper regions 56a of the polysilicon gate conductors are then etched, as depicted in FIG. 7. An anisotropic etch in which ion ablation of upper regions 56a occurs at a faster rate in a vertical direction than in a horizontal direction may be used. A plasma may be generated from a gas bearing fluorine- and chlorine- containing molecules, such as $SF_6$ and $Cl_2$ to provide for an anisotropic etch which is highly selective to polysilicon. Upper regions 56a are etched down to etch stop regions 58, and then the etch is terminated. Since etch stop regions 58 etch at a significantly lower rate than upper regions 56, substantial portions of the etch stop regions are inhibited from being removed before the etch can be stopped. As a result, the lateral width of each of the upper portions 56a is reduced such that it is smaller than the lateral width of each of the etch stop regions 58 and the lower portions 56b of the gate conductors. The resulting opposed sidewall surfaces of the upper portions 56a are spaced apart by a distance less that that by which the opposed sidewall surfaces of the lower portions 56b are spaced apart.

Dopant species are then implanted into substrate 50 at a relatively high dose and energy to form source/drain regions 64 and LDD areas 66. Energetic dopant ions passing through masking structures 62 and upper portions 56a of the gate conductors collide with silicon atoms, causing the ions to lose energy. Some ions eventually lose so much energy that they come to rest within masking structures 62 and upper portions 56a. After passing through masking structures 62 and upper portions 56a, other ions may have enough energy to migrate into etch stop regions 56b or even farther into lower regions 56b. Those ions, however, do not have enough energy remaining to pass into underlying channel regions within substrate 50. The energetic dopant ions that initially strike the upper surfaces of the opposed lateral ends of etch stop regions 56b only have to pass through etch stop regions 56b, lower regions 56b, and gate oxide 52 to reach substrate 50. As such, some of those dopant ions become implanted into substrate 50 while others never reach the substrate. In this manner, LDD areas 66 aligned between the opposed sidewall surfaces of upper portions 56a and the opposed sidewall surfaces of lower portions 56b are formed within substrate 50. The physical channel length, L, of the channel region arranged laterally between each of the LDD areas 66 is thus substantially equivalent to the lateral width of upper portion 56a of the overlying gate conductor.

A substantial portion of the energetic ions which immediately impinge upon gate oxide 52 without passing through the gate conductors become implanted into source/drain regions 64 of substrate 50. Source/drain regions 64 are aligned to the opposed sidewall surfaces of lower portions 56b of the gate conductors. Isolation structure 48 isolates source/drain regions 64 which are to belong to different ensuing transistors and serves to prevent those source/drain regions from electrically communicating with each other. The dopant species used for the single implant hereof are opposite in type from those within the bulk of substrate 50. Further, the dopant energy and concentrations may be adjusted so that the LDD profile is shallower and of lesser concentration than the source/drain profile. If a PMOS integrated circuit is being formed, ion implantation of p-type species is performed, and if an NMOS integrated circuit is being formed, n-type species are implanted into substrate 50. Optionally, a CMOS integrated circuit containing both PMOSFET and NMOSFET devices may be formed. Formation of a CMOS circuit involves masking the active areas (i.e., those areas between isolation regions) of substrate 50 which are to contain one type of dopant species while implanting the other type of dopant species into unmasked active areas, followed by the opposite procedure. Some commonly used n-type dopants are arsenic or phosphorus, and some commonly used p-type dopants are boron or boron difluoride. A post-implant anneal may be performed to activate and position the as-implanted impurities.

Figure 9:
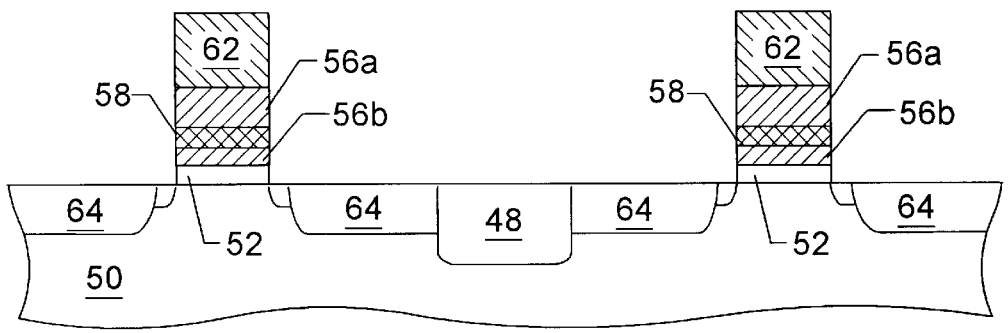
FIG. 9 is a cross-sectional view of the semiconductor topography, wherein portions of the gate oxide and the gate conductors not covered by the photoresist structures are removed, subsequent to the step in FIG. 8.
Figure 10:
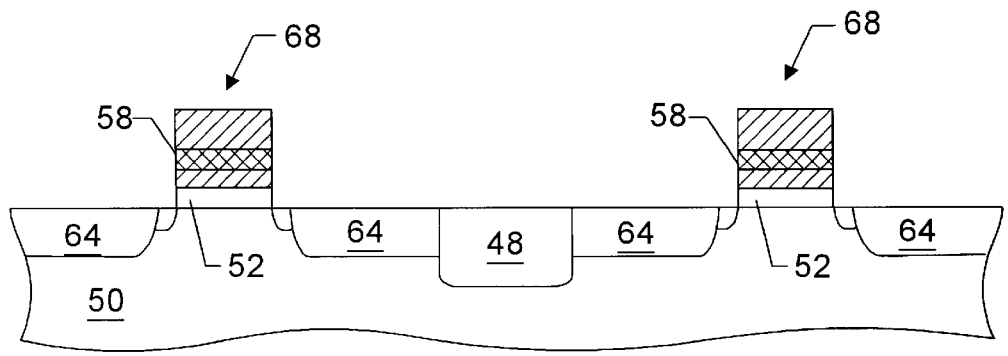
FIG. 10 is a cross-sectional view of the semiconductor topography, wherein the photoresist structures are removed from above the gate conductors, subsequent to the step in FIG. 9.

FIG. 9 illustrates the removal of portions of the upper portions 56b and the etch stop regions 58 of the gate conductors not covered by masking structures 62. Those portions may be removed using, e.g., a dry, plasma etch technique. In addition to those portions of the gate conductors, portions of gate oxide 52 not arranged directly below masking structures 62 may also be etched. The etch duration is chosen to terminate before substantial portions of substrate 50 can be removed. Thereafter, masking structures 62 are removed using, e.g., an organic-based photoresist stripper, thereby exposing doped polysilicon gate conductors 68, as shown in FIG. 10.

Figure 11:
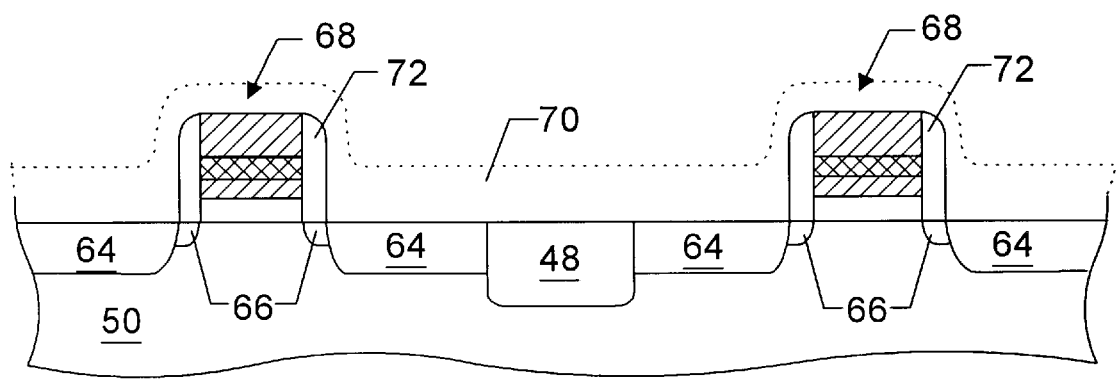
FIG. 11 is a cross-sectional view of the semiconductor topography, wherein sidewall spacers are formed upon opposed sidewall surfaces of the gate conductors, subsequent to the step in FIG. 10.
Figure 12:
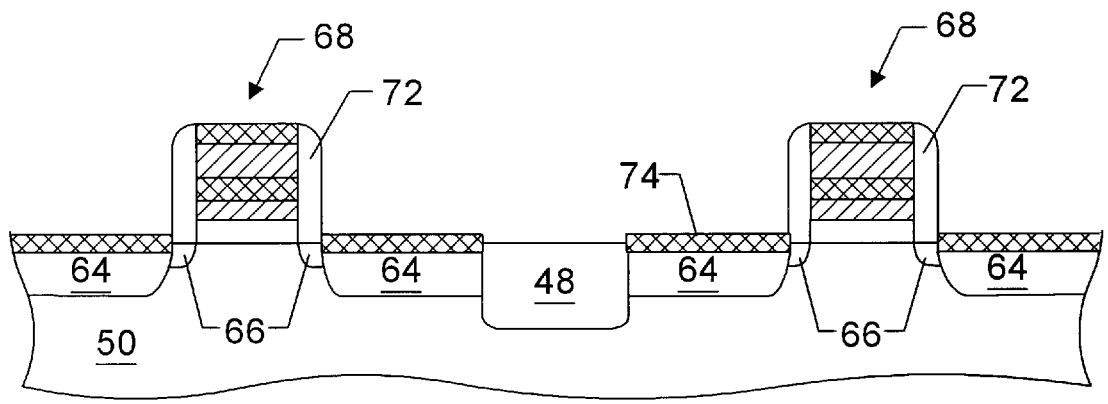
FIG. 12 is a cross-sectional view of the semiconductor topography, wherein silicide is formed upon the source/drain regions and the gate conductors, subsequent to the step in FIG. 11.

Turning to FIG. 11, sidewall spacers 72 may then be formed upon the opposed sidewall surfaces of gate conductors 68. Sidewall spacers 72 may be formed by depositing a dielectric material 70, e.g., silicon nitride, silicon dioxide, or oxynitride across exposed surfaces of gate conductors 68 and substrate 50. Dielectric material 70 is anisotropically etched until a pre-defined lateral thickness of the dielectric material has been retained upon the sidewall surfaces of gate conductors 68. In this manner, sidewall spacers 72 are formed upon LDD areas 66 within substrate 50 to complete the formation of transistors upon and within substrate 50. A metal silicide 68 may then be formed upon the silicon-based source/drain regions 64 and the upper surfaces of polysilicon gate conductors 68 by heating a refractory metal, e.g., titanium or cobalt, deposited across the semiconductor topography. The metal reacts with underlying silicon to form metal silicide 68. Unreacted portions of the refractory metal are etched away using, e.g., an isotropic etch highly selective to the metal. An interlevel dielectric may subsequently be deposited across the semiconductor topography and conductive contacts formed through the interlevel dielectric to metal silicide 68. Interconnect may be routed across the interlevel dielectric to electrically link various contacts.

It will be appreciated to those skilled in the art having the benefit of this disclosure that this invention is believed to provide a method for forming a transistor gate conductor having an etch stop arranged at a depth below its upper surface such that the lateral width of the gate conductor above the etch stop may be exclusively narrowed to provide for reduction of transistor channel length. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming a transistor, comprising:
   implanting atoms into a region of a gate conductor spaced below an upper surface of the gate conductor, thereby forming an etch stop within said gate conductor;
   patterning a masking layer above a select portion of said gate conductor to define a first pair of opposed sidewalls of said masking layer;
   removing said gate conductor exclusive of said select portion such that said gate conductor is arranged exclusively underneath said masking layer;
   etching said masking layer to define a second pair of opposed sidewalls of said masking layer; and
   removing portions of said gate conductor arranged above said etch stop and uncovered by said masking layer.

2. The method of claim 1, wherein said masking layer is arranged directly upon said upper surface of the gate conductor.

3. The method of claim 1, wherein said atoms comprise nitrogen atoms.

4. The method of claim 1, wherein said first pair of opposed sidewalls of said masking layer are spaced apart by a first distance greater than a second distance by which said second pair of opposed sidewalls are spaced apart.

5. The method of claim 1, wherein said masking layer comprises photoresist.

6. The method of claim 1, wherein a lower region of said gate conductor arranged underneath said etch stop comprises first opposed sidewall surfaces, and wherein an upper region of said gate conductor arranged above said etch stop comprises second opposed sidewall surfaces.

7. The method of claim 6, wherein said first pair of sidewalls of said masking layer are spaced apart by a first distance, and wherein said first opposed sidewall surfaces of said gate conductor are spaced apart by said first distance.

8. The method of claim 7, wherein said second pair of sidewalls of said masking layer are spaced apart by a second distance, and wherein said second opposed sidewall surfaces of said gate conductor are spaced apart by said second distance.

9. The method of claim 8, wherein said second distance is less than said first distance.

10. The method of claim 6, further comprising forwarding a single impurity distribution into a substrate arranged below said gate conductor subsequent to said removing the portions of said gate conductor, thereby forming lightly doped drain (LDD) areas within said substrate self-aligned between said first opposed sidewall surfaces and said second opposed sidewall surfaces, and thereby forming source/drain regions within said substrate self-aligned to said second opposed sidewall surfaces.

11. The method of claim 10, wherein said LDD areas and said source/drain regions are concurrently formed.

12. The method of claim 1, wherein said gate conductor comprises doped polysilicon.

* * * * *